US006192487B1

(12) United States Patent
Douceur

(10) Patent No.: US 6,192,487 B1
(45) Date of Patent: *Feb. 20, 2001

(54) METHOD AND SYSTEM FOR REMAPPING PHYSICAL MEMORY

(75) Inventor: John R. Douceur, Bellevue, WA (US)

(73) Assignee: Microsoft Corporation, Redmond, WA (US)

(*) Notice: Under 35 U.S.C. 154(b), the term of this patent shall be extended for 0 days.

This patent is subject to a terminal disclaimer.

(21) Appl. No.: 09/141,630

(22) Filed: Aug. 28, 1998

Related U.S. Application Data

(63) Continuation of application No. 08/777,165, filed on Dec. 26, 1996, now Pat. No. 5,838,893.

(51) Int. Cl.⁷ .................................................. G06F 11/22
(52) U.S. Cl. .................................. 714/8; 714/9; 711/207; 711/202
(58) Field of Search .............................. 714/7, 8, 42, 54, 714/2, 6; 711/207, 202

(56) References Cited

U.S. PATENT DOCUMENTS

| 4,410,941 | 10/1983 | Barrow et al. | 364/200 |
|---|---|---|---|
| 4,441,155 | 4/1984 | Fletcher et al. | 364/200 |
| 4,774,652 | 9/1988 | Dhuey et al. | 364/200 |
| 5,146,571 | 9/1992 | Logan | 395/400 |
| 5,253,350 | 10/1993 | Foster et al. | 395/400 |
| 5,265,227 | 11/1993 | Kohn et al. | 395/400 |
| 5,838,893 | * 11/1998 | Douceur | 714/7 |

OTHER PUBLICATIONS

Anderson, Don and Shanley, Tom, *Pentium Processor System Architecture*, MindShare, Inc., 1995, pp. 93–135.

Hummel, Robert L., *PC Magazine Programmer's Technical Reference : The Processor and Coprocessor*, Ziff–Davis Press, Emeryville, California, 1992, vii–xiii, pp. 85–105.

Madnick, Stuart E. and Donovan, John J., *Operating Systems*, McGraw–Hill, Inc., U.S.A., 1974, pp. vii–xii, pp. 105–208.

* cited by examiner

Primary Examiner—Ly V. Hua
(74) Attorney, Agent, or Firm—Leydig, Voit & Mayer Ltd.

(57) ABSTRACT

A method and system for remapping physical memory that is malfunctioning. The physical memory has memory locations with addresses. The addresses are ordered from a lowest to a highest address, and each address has bits ordered from a highest-order bit to a lowest-order bit. The system scans physical memory to determine which memory locations are malfunctioning. The system identifies a lowest address and a highest address of the memory locations that are malfunctioning. The system then identifies the highest-order, contiguous bits of the lowest address that are the same as the highest-order, contiguous bits of the highest address. The system generates a remapping value whose highest-order bits are equal to the inverse of the identified highest-order, contiguous bits of the address and whose lowest-order bits are all zeroes. When the system receives an address to access physical memory, the system generates a remapped address by performing a bitwise exclusive-OR of the received address with the remapping value. The system then accesses physical memory using the generated remapped address.

28 Claims, 9 Drawing Sheets

| CPU | mem |
|---|---|
| 0000 | 1010 |
| 0001 | 1011 |
| 0010 | 1000 |
| 0011 | 1001 |
| 0100 | 1110 |
| 0101 | 1111 |
| 0110 | 1100 |
| 0111 | 1101 |
| 1000 | 0010 |
| 1001 | 0011 |
| 1010 | 0000 |
| 1011 | 0001 |
| 1100 | 0110 |
| 1101 | 0111 |
| 1110 | 0100 |
| 1111 | 0101 |

Figure 4

METHOD AND SYSTEM FOR REMAPPING PHYSICAL MEMORY

CROSS-REFERENCE TO RELATED APPLICATION

This application is a continuation of U.S. patent application Ser. No. 08/777,165, filed Dec. 26, 1996 now U.S. Pat. No. 5,838,893.

TECHNICAL FIELD

This invention relates generally to a computer memory management system, and more specifically, to a method and system for remapping physical memory.

BACKGROUND OF THE INVENTION

Most modern central processing units (CPUs) of computer systems allow the address space of the CPU ("logical address space") to have a different size than the available physical memory. These CPUs provide an address translation mechanism that translates the logical addresses to physical addresses that refer to locations in actual physical memory. Such address translation mechanisms are referred to as virtual memory systems. The virtual memory systems typically allow a larger logical address space than is physically available. The virtual memory systems also allow multiple programs to reside simultaneously in memory without each needing to know the location of its physical base address. Rather, such multiple programs need only know their logical base address.

FIG. 1 shows the paging portion of the virtual memory system of the Intel 80x86-family of processors. The 32-bit linear address 101, which is generated by the CPU, has a 12-bit offset 102 and a 20-bit page table index 103. The 80x86 page size is 4K bytes ($2^{12}$) so the 12-bit offset is sufficient to access every location on a page. The page table 104 contains an entry for each page defined in the system. (The 80x86 actually uses a 2-tiered page table, but those details are not necessary to understand the present invention.) The entries contain a 20-bit page frame address 105, which is a base address of a corresponding page in physical memory. The virtual memory system translates a 32-bit linear address into a physical address in the following manner. The virtual memory system uses the page table index 103 as an index into the page table 104 to retrieve the page frame address stored in that entry. The physical address 108 is formed with the indexed page frame address 105 as the 20 high-order bits and the offset 102 as the 12 low-order bits. The physical address 108 points to a location in physical memory 109. In this example, there are 4 G ($2^{32}$) addresses in the logical address space and 16 M ($2^{24}$) physical memory locations.

When a computer system is first started up, the firmware in ROM typically checks physical memory to determine the limits of available physical address space. Typically, the firmware will write various test patterns to successive memory locations and then read the test patterns to ensure that the memory locations stored the test patterns correctly. When a memory location fails to store a value correctly, the firmware typically assumes that it either has ventured beyond the address range of installed memory or has encountered a malfunctioning (i.e., bad) memory location. Typically, the firmware then terminates memory testing and sets the amount of available memory to the lowest address of a bad memory location. For example, if a physical memory location at address 00FFE100 (addresses are shown in hexadecimal notation) is determined to be malfunctioning, then the firmware would set the amount of available memory to 00FFE100. Thus, memory locations at addresses 00000000 to 00FFE0FF would be available. The firmware then stores this information so that it can be retrieved by the operating system. When the operating system is started, it reads the information about available physical memory that was stored by the firmware. For an operating system that is able to utilize only a single contiguous area of physical memory, this would allow the operating system to store information at any memory location within the available memory, but would prevent the operating system from storing any data in physical memory at or above the first location that is bad. A downside, however, of setting the available memory to the lowest address of a bad location is that any good locations above (i.e., with higher addresses) that bad location are not accessible. Indeed, if an error occurred in the memory location in the first page of physical memory, then virtually all physical memory would be unavailable. In such a circumstance, it is likely that the operating system would not even be able to start.

Some operating systems do not encounter this problem because they are able to use non-contiguous portions of physical memory. For example, if a memory error occurs in one page of physical memory, the operating system simply marks that page as unavailable and is able to use all the other pages even though they may have higher physical memory addresses. The operating system simply maps logical addresses to physical addresses to avoid pages with bad memory locations. This mapping of pages is performed by using the page table of the CPU.

The high-order bits of the physical address from the CPU are decoded by a memory controller to produce selection signals, each of which activates a separate memory device. Some memory controllers provide a configurable assignment of the high-order physical address bits to the selected inputs of the memory devices, which effectively changes the base address of each memory device. FIG. 2 illustrates the decoding of the high-order bits of a physical address to the select inputs of the memory devices. (This is a highly simplified illustration; in particular, the splitting of the low-order address bits into row and column addresses and their subsequent multiplexing to the memory devices are not shown, since these operations are unrelated to the present invention.) The processor 201 outputs address lines $A_0$–$A_{31}$. The low-order bits $A_0$–$A_{21}$ are used to select an address within a selected 4 M memory device 203. Of the high-order bits $A_{22}$–$A_{31}$, the least significant two, $A_{22}$–$A_{23}$, are decoded by the decoder 202 into four separate select signals $S_0$–$S_3$, which are in turn used to select one of the memory devices 203. Some memory controllers have a fixed assignment of address bit combinations to select signals, such that value 00 activates select signal 0, value 01 activates select signal 1, and so forth. However, if the memory controller supports configurable strobes, then the processor can modify this assignment. Thus, if the firmware detects that one of the memory devices is malfunctioning, then the firmware can map that memory device to the highest physical address and set the amount of available memory to exclude that memory device. A downside with such a mapping is that the granularity is limited to the size of a memory device, and therefore the memory locations above the lowest address of a bad memory location on a memory device are still unavailable. As memory devices grow in size, this limitation will become progressively more significant.

SUMMARY OF THE INVENTION

The present invention provides a method and system for remapping memory addresses that address bad memory locations. The system checks memory to find a range of memory locations that include all the bad memory locations. The lowest range address and the highest range address in the range delimit the memory locations to be remapped. The system then generates a remapping value that when applied to the addresses in the range remaps the range of bad addresses to the highest possible addresses. When the system receives an address to use in accessing memory, the system generates a remapped address by applying the remapping value to the received address. The system then accesses memory using the remapped address. Since the highest memory addresses access the bad memory locations, the amount of available memory can be set to just below the lowest memory address of a bad memory location. In this way, addresses from 0 to the amount of available memory each access a good memory location.

In one embodiment, the system generates the remapping value by setting its highest-order bits to the bitwise inverse of the highest-order, contiguous bits of the lowest address of the range that match those of the highest address of the range and by setting all of its other bits to 0. The system also generates a memory size value (indicating an amount of available memory) that contains 1's in the highest-order, contiguous bits corresponding to the highest-order, contiguous bits of the lowest address of the range that match those of the highest address of the range and that contains the lowest-order, contiguous bits of the lowest address of the range in all other bits. The system applies the remapping value to the received address by performing a bitwise exclusive-OR of the bits of the received address with the bits of the remapping value. The system stores the generated remapping value in a register, and the bitwise exclusive-OR is performed by hardware comprising an exclusive-OR gate for each bit of the address with the bits of the received address and of the remapping value as input.

BRIEF DESCRIPTION OF THE DRAWINGS

FIG. 4 contains a table that illustrates the remapping of the physical memory addresses.

DETAILED DESCRIPTION OF THE INVENTION

The present invention provides a method and system for remapping physical memory addresses so that the physical memory addresses of bad memory locations are in the high physical memory addresses. The remapping system scans physical memory to determine which memory locations are bad. The system then identifies the lowest address and the highest address of the memory locations that are bad. The system then generates a remapping value that will remap this range of memory locations (i.e., from the lowest bad address to the highest bad address) to the highest physical memory address range. The system first identifies the highest-order, contiguous bits of the lowest address in the range that are the same as the highest-order, contiguous bits of the highest address in the range. The system then generates a remapping value whose highest-order bits are equal to the inverse of the identified highest-order, contiguous bits of the address and whose lowest-order bits are all zeroes. When a request is received to access a physical memory location, the system generates a remapped address by performing a bitwise exclusive-OR of the received address with the remapping value. The system then uses this remapped address to access memory.

Figure 1:
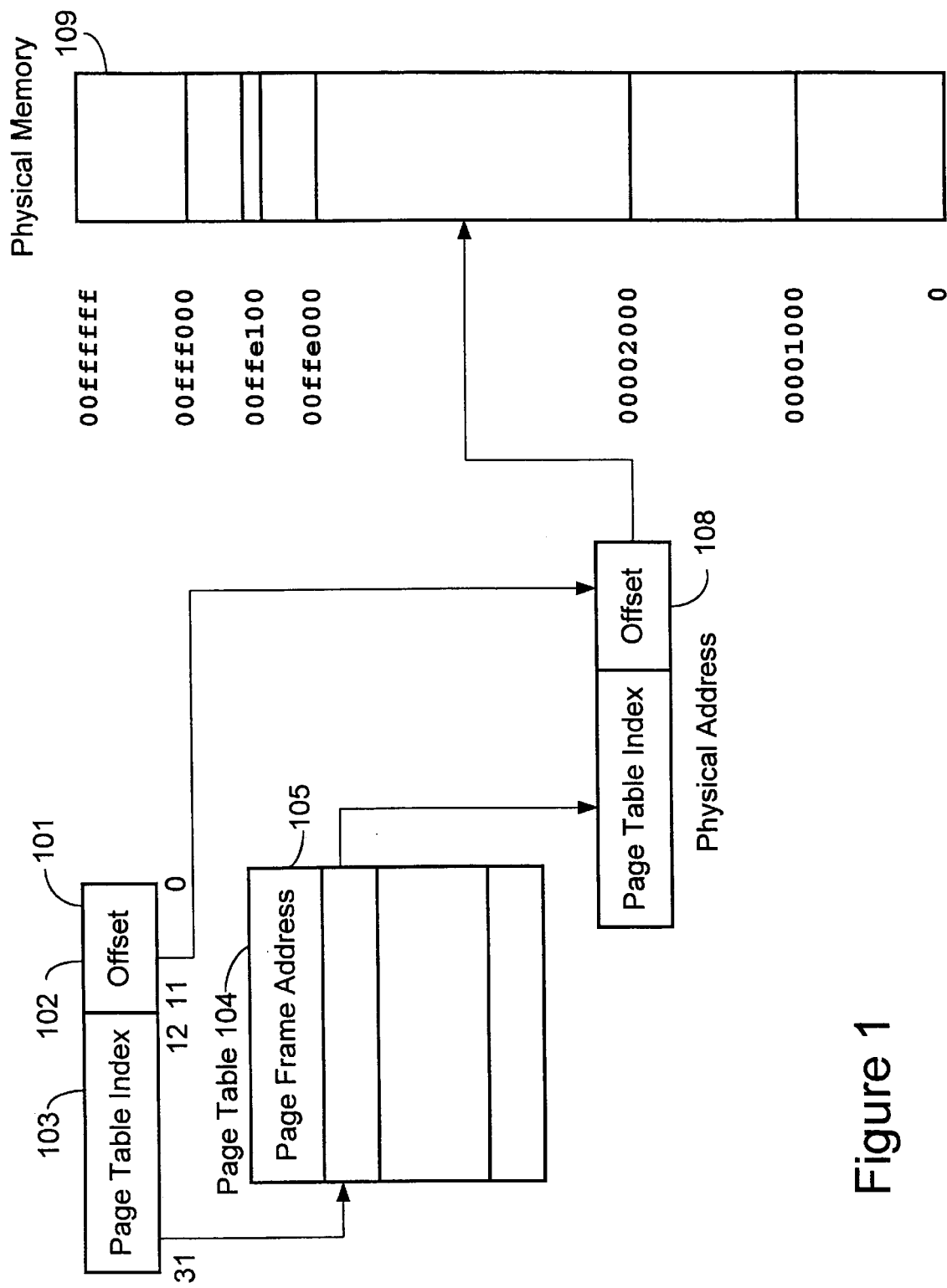
FIG. 1 shows the paging portion of the virtual memory system of the Intel 80x86-family of processors.
Figure 2:
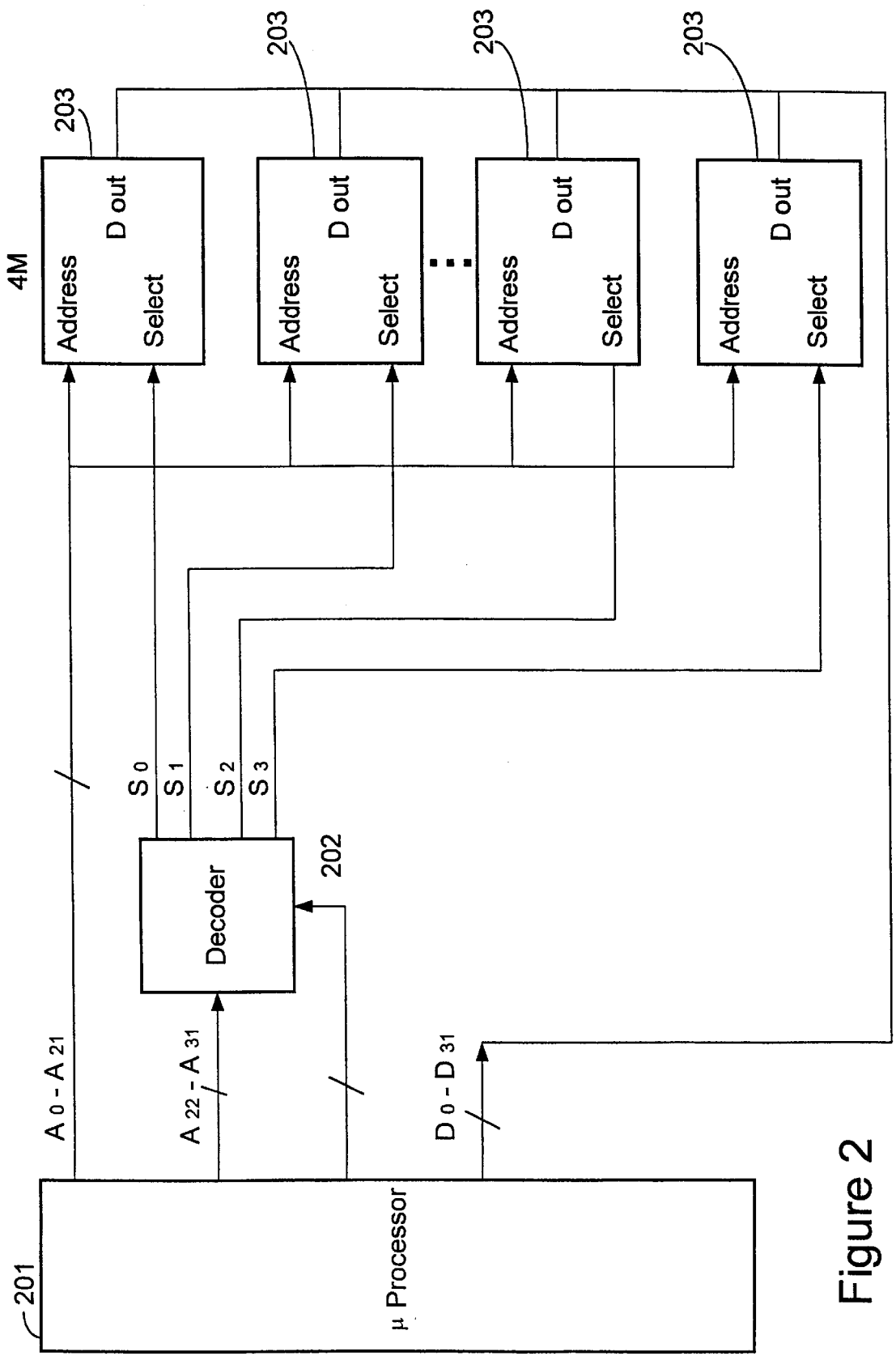
FIG. 2 illustrates the decoding of the high-order bits of a physical address to the memory devices.
Figure 3:
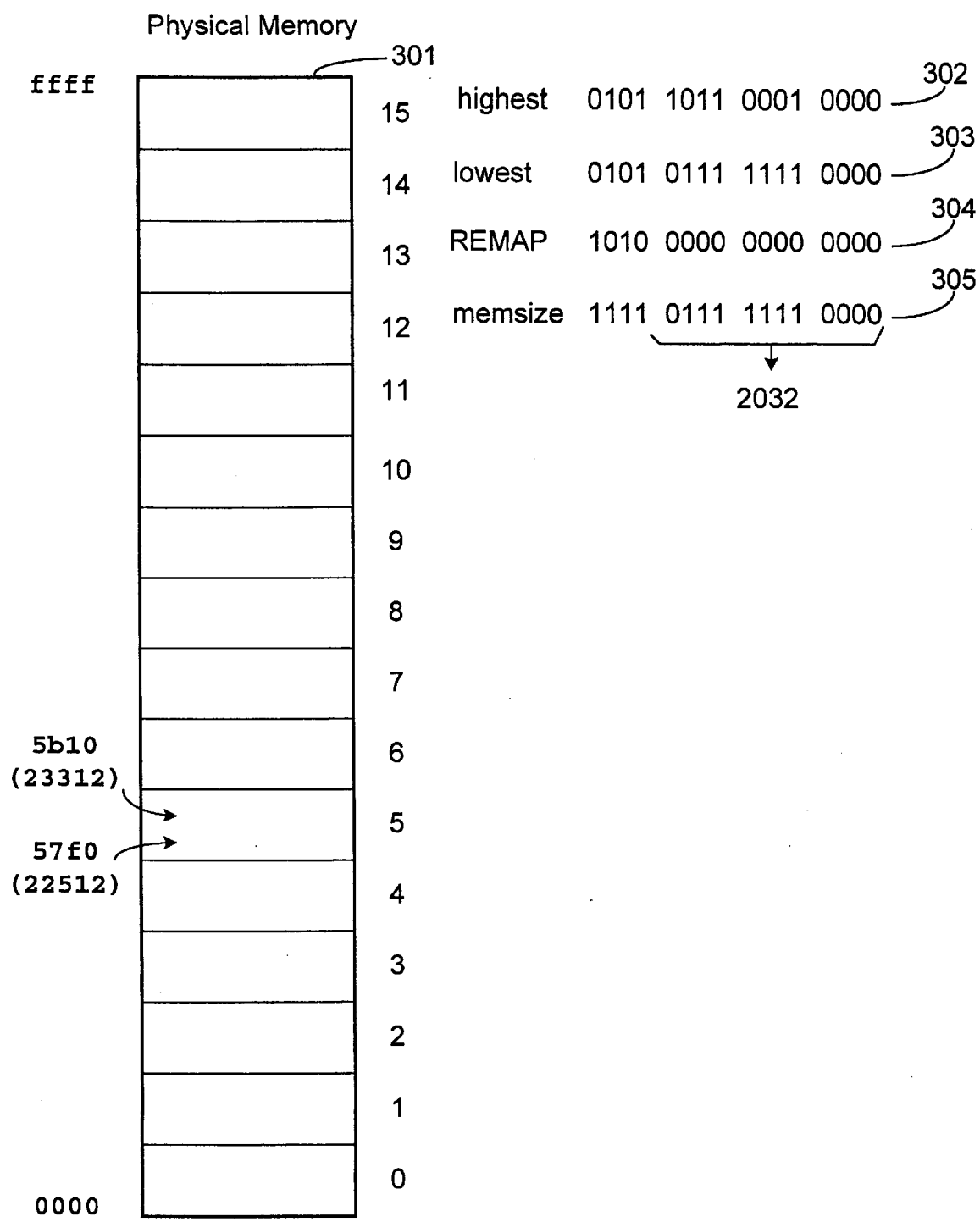
FIG. 3 illustrates generating the remapping value.

FIG. 3 illustrates generating the remapping value. In this example, physical memory 301 has 64K memory locations. Thus, the physical memory has 16 pages of 4K memory locations each. When scanning physical memory, the system detects the lowest address of a bad memory location and the highest address of a bad memory location. In this example, the lowest address is 57F0 and the highest address is 5B10, which happen to be on page number 5 of physical memory. To generate the remapping value, the system compares the bit values of the highest address 302 and the bit values of the lowest address 303. The system determines that the four highest-order, contiguous bits, 0101, of the highest address and the lowest address are the same. The system then generates the remapping value by taking the bitwise inverse of those 4 bits, which is 1010, and stores that bitwise inverse as the highest-order bits of the remapping value 304. The system then sets all other bits of the remapping value to zero. When a physical memory address is generated by the processor, the system exclusive-ORs that address with this remapping value to generate the remapped physical memory address.

FIG. 4 contains a table that illustrates the remapping of the physical memory addresses. When the bits 0000 are exclusive-ORed with the bits 1010 of the remapping value, the result is bits 1010. Of particular interest is that the bits 0101, which correspond to the highest-order bits of the lowest address and highest address in the range, when exclusive-ORed with the bits 1010 result in the bits 1111. The bits 1111 result in selecting the highest physical memory addresses. Thus, any physical memory address in the range from the lowest address to the highest address is mapped to high physical memory address. Thus, the contiguous area of physical memory below the remapped lowest address is now available. The system also sets the memory size 305 by setting the number of highest-order bits (e.g., 4) to 1 and then setting the lowest-order bits to the lowest-order bits of the lowest address of the range. Thus, the highest available address is just below the remapped lowest address.

Figure 5:
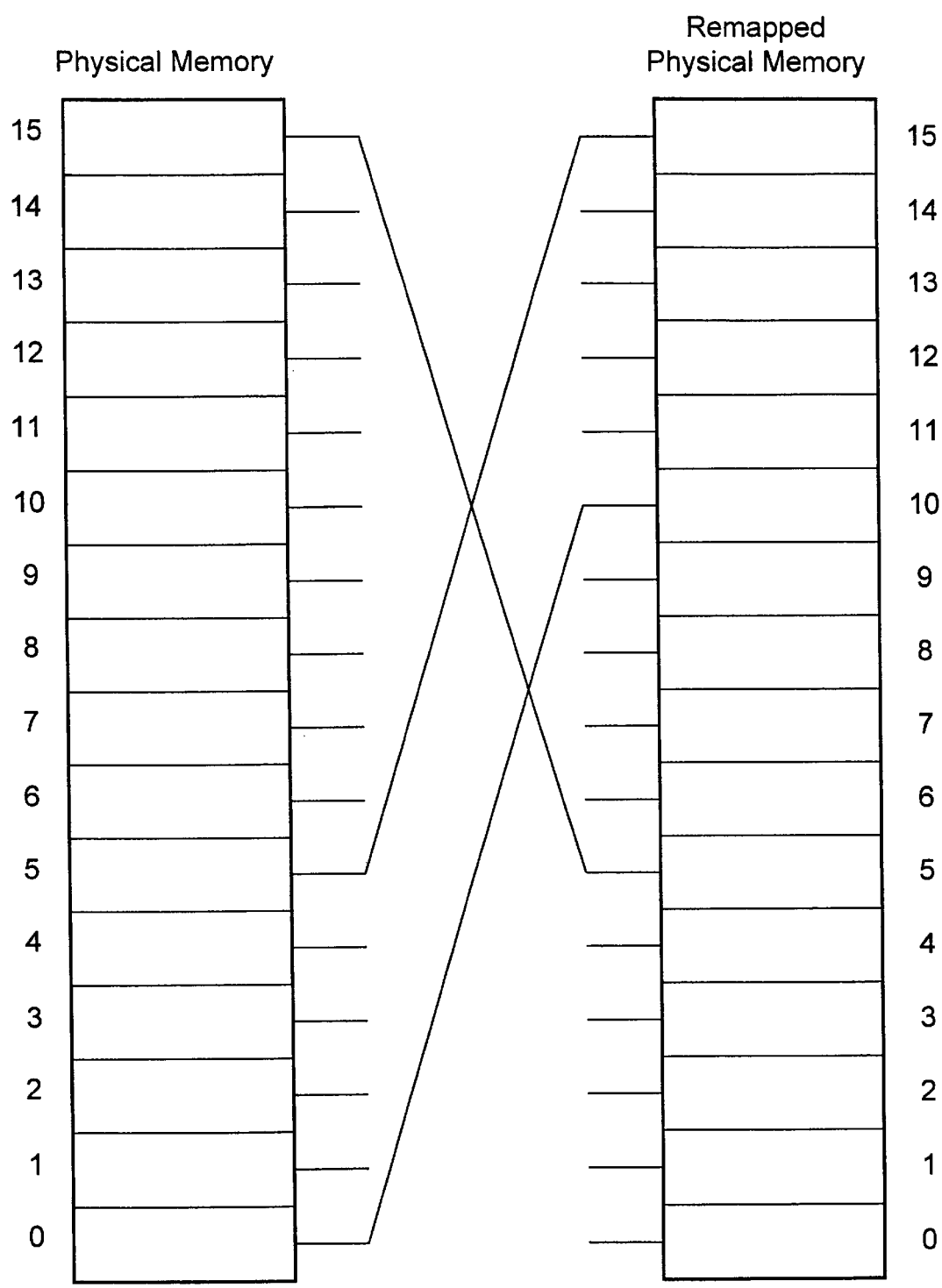
FIG. 5 illustrates the remapping of physical memory.

FIG. 5 illustrates the remapping of physical memory. As shown, page 5, which contains the bad memory locations, is mapped to page 15 in remapped physical memory and page 15 of physical memory is remapped to page 5 of physical memory. In this example, the bad memory locations happened to have the same four highest-order bits of their memory addresses. Thus, each page is remapped to a page. If the addresses had the same five higher-order bits, then the remapping value would result in remapping each half page to a new half page.

Figure 6:
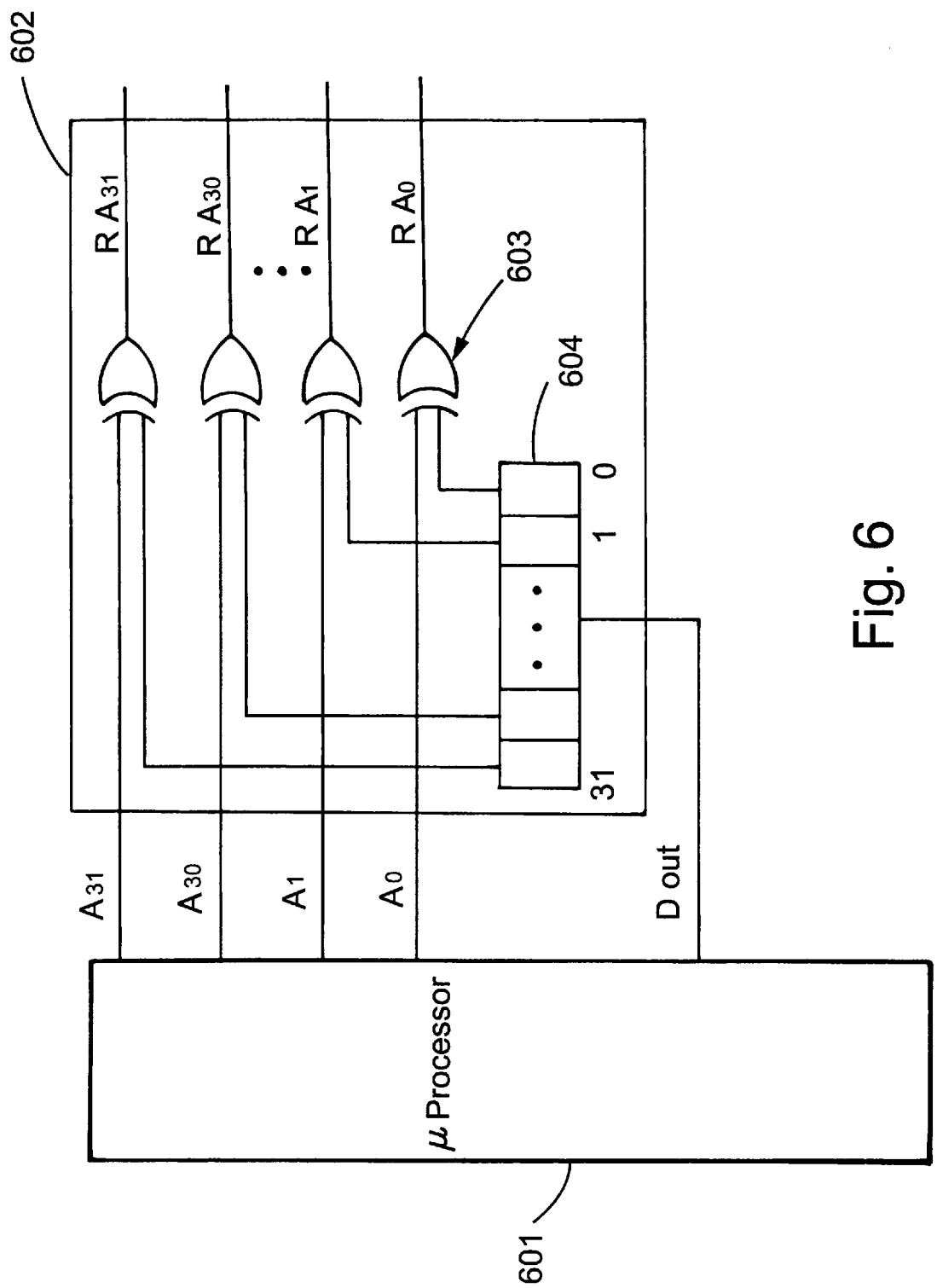
FIG. 6 is a block diagram illustrating a remapping component that is external to the processor.

FIG. 6 is a block diagram illustrating a remapping component that is external to the processor. The addresses $A_0$–$A_3$, of a processor 601 are input into the remapping component 602. The remapping component 602 contains an array of exclusive-OR gates 603 and a remapping register 604. The array contains one exclusive OR gate for each address line, and the register contains one bit for each address line. When the system generates a remapping value, the system stores the remapping value in the remapping register 604. From then on, any address that is output by the processor is remapped in accordance with the remapping value.

Figure 7:
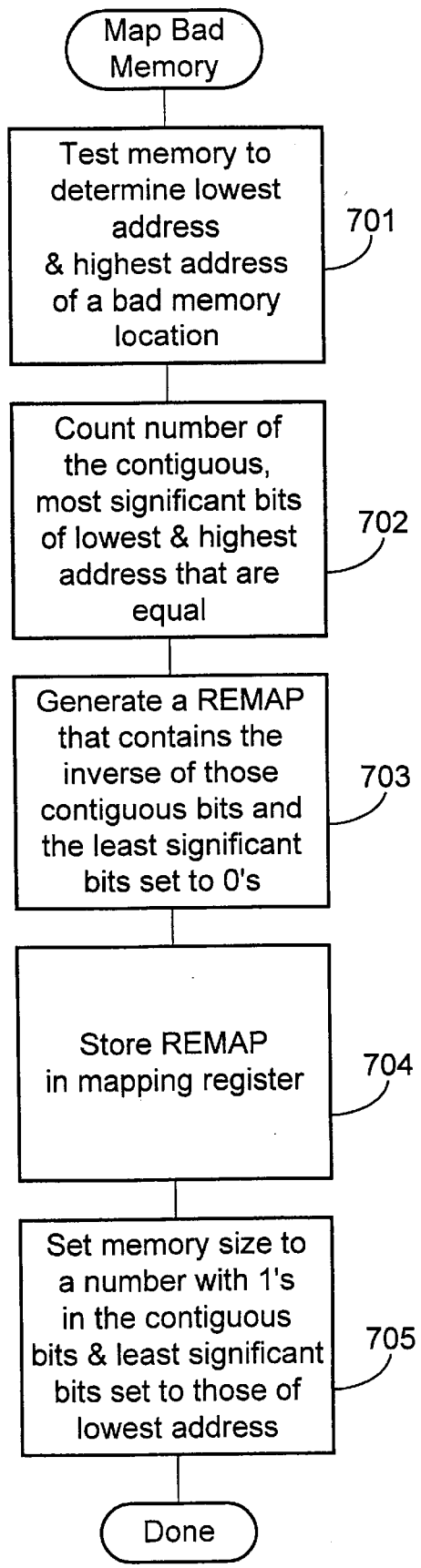
FIG. 7 is a flow diagram of an implementation of a routine to set the remapping value.

FIG. 7 is a flow diagram of an implementation of a routine to set the remapping value. In step 701, the system tests memory to determine the address of the lowest and highest bad memory locations. This testing can be performed using various well-known memory testing techniques. In step 702, the system counts the number of highest-order, contiguous bits of the lowest and highest addresses that are equal. This may be performed by scanning the higherorder bits of the lowest address and the highest address in parallel until a bit in one does not match a corresponding bit in the other. In step 703, the system generates the remapping value by setting the highest-order, contiguous bits of the remapping value to the inverse of the highest-order, contiguous bits that are the same in the lowest and highest addresses. The system then sets the lowest-order, contiguous bits of the remapping value to zero. In step 704, the system stores the remapping value into the remapping register. In step 705, the system determines the amount of available memory by setting that counted number of the highest-order, contiguous bits to 1, and setting the lowest-order, contiguous bits of the amount of available memory to the corresponding lowest-order, contiguous bits of the lowest address.

Figure 8:
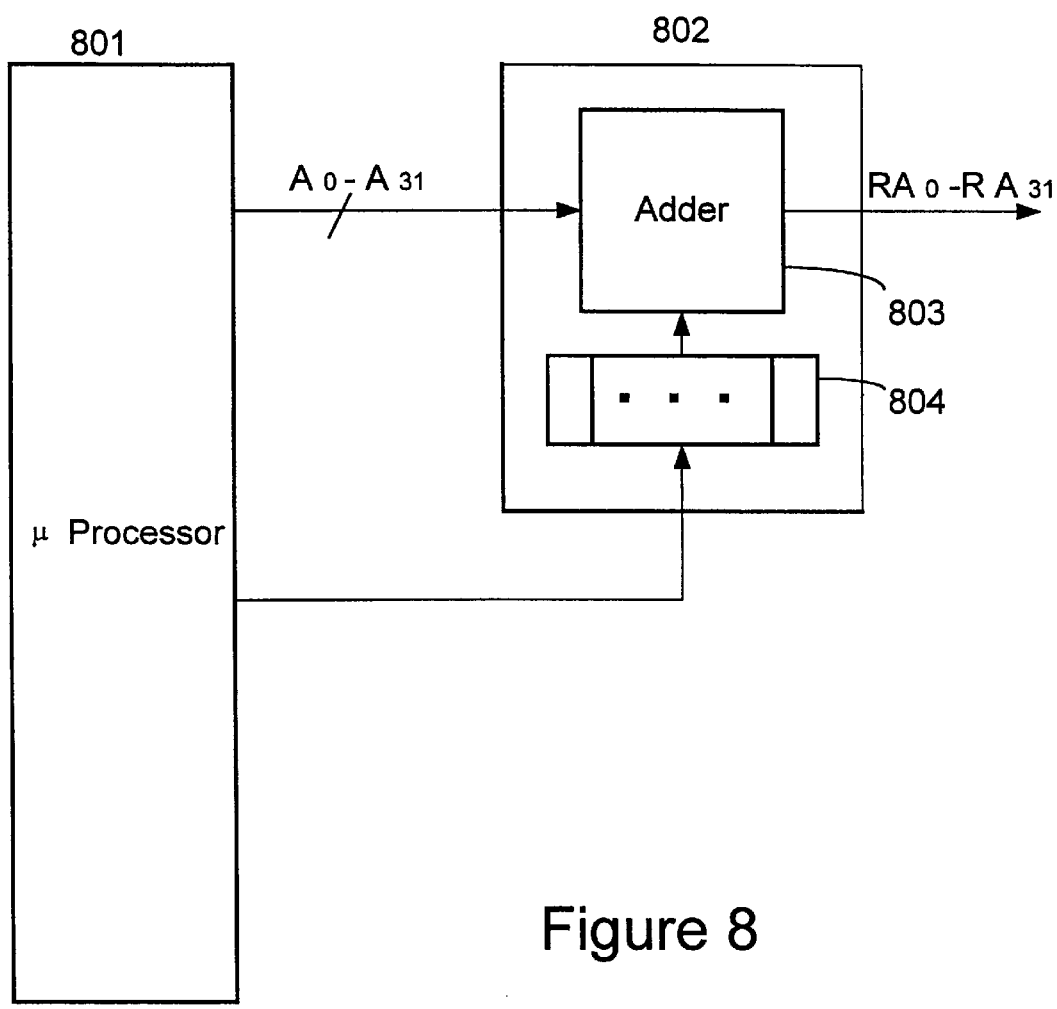
FIG. 8 is a block diagram illustrating an alternate remapping component.

FIG. 8 is a block diagram illustrating an alternate remapping component. The alternate remapping component 802 contains an adder 803 and a register 804. The adder is designed to add two numbers that have 1 bit for each address line. The register 804 contains a bit for each address line. To remap the addresses, the system sets a value in the register, which is then added to each address to result in the remapped address $RA_0$–$RA_{31}$. The use of the adder, rather than the array exclusive-OR gates, permits the actual range of bad memory locations to be mapped to the highest addresses. In particular, the highest bad address is mapped to the highest address of physical memory. When the array exclusive-OR gates are used in the remapping component, some good memory locations above the highest address in the range can be mapped to the highest memory and may be inaccessible.

Figure 9:
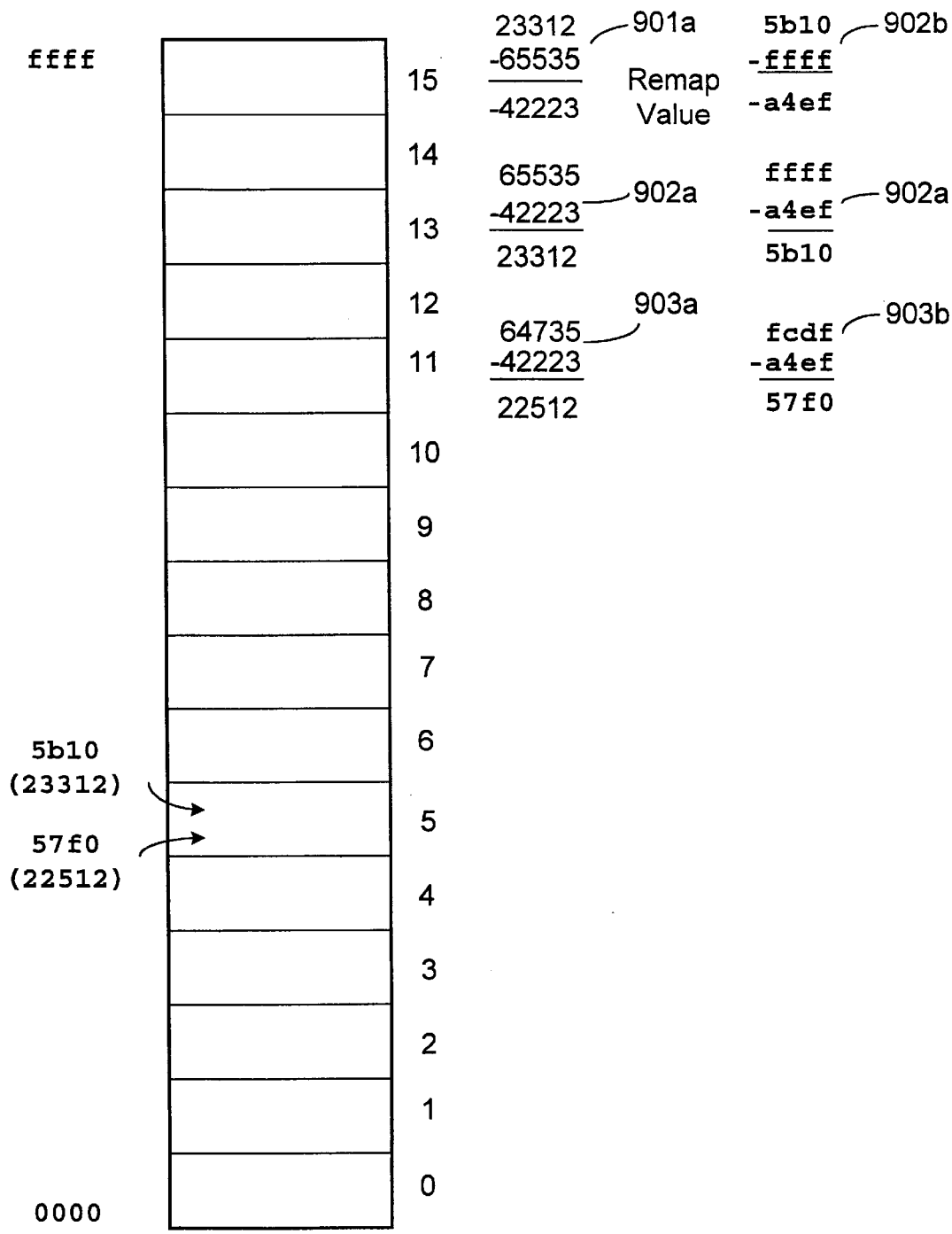
FIG. 9 illustrates the computation of the remapping value with a remapping component that uses an adder.

FIG. 9 illustrates the computation of the remapping value with a remapping component that uses an adder. The remapping value is calculated by subtracting the highest address of physical memory from the highest address in the range of bad memory locations. When the range of addresses is from address 57F0 to address 5B10, then the remapping value is –A4EF, as shown by 901b. When the address FFFF is input into the remapping component and when the register is loaded with –A4EF, then the output is 5B10, as shown by 902b. Thus, the memory location with the highest address in the range is mapped to physical address FFFF. In a similar manner, when the address FCDF is input to the remapping component and when the remapping value is –A4EF, the output is 57F0, as shown in 903b.

Although the present invention is described in terms of preferred embodiments, it is not intended that the invention be limited to these embodiments. Modification within the spirit of the invention will be apparent to those skilled in the art. For example, the remapping component can be included internally within the processor or the memory controller, rather than externally. Also, a remapping component can be used to remap bad memory locations in cache memory that is used by a processor. In addition, the remapping component can alternately be used to remap portions of physical memory that have no bad memory locations. The scope of the present invention is defined by the claims that follow.

What is claimed is:

1. A method for remapping a portion of physical memory, the physical memory having memory locations, each location having an address, the addresses being ordered from a lowest address to a highest address, the method comprising:
   receiving an indication of the portion of physical memory to be mapped; and
   mapping the locations of the indicated portion of physical memory to the highest addresses in physical memory so that the locations of the other portion of physical memory are mapped to the lowest addresses.

2. The method of claim 1 wherein the addresses of the locations of the indicated portion are contiguous before and after mapping.

3. The method of claim 1 wherein a number of locations in the indicated portion of physical memory is a power of 2.

4. The method of claim 1 wherein the locations of the other portion of physical memory are mapped to contiguous addresses.

5. The method of claim 1 wherein the indicated portion of physical memory has malfunctioned.

6. The method of claim 1 wherein after mapping the locations of the indication portion of physical memory, the indicated portion of physical memory is outside a range of accessible physical memory.

7. The method of claim 1 wherein if the indicated portion of physical memory does not have a number of locations that is a power of 2, increasing the number of locations within the indicated portion so that it is a power of 2.

8. The method of claim 1 wherein before mapping the locations, the addresses of the locations of the other portion include addresses that are less than the addresses of the locations of the indicated portion and include addresses that are greater than the addresses of the locations of the indicated portion.

9. The method of claim 1 wherein the portion of physical memory to be mapped has a lowest address and a highest address that delimit the portion and wherein mapping includes
   identifying the highest-order, contiguous bits of the lowest address that are the same as the highest-order, contiguous bits of the highest address;
   generating a mapping value that contains a bitwise inverse of each of the identified highest-order, contiguous bits as the highest-order, contiguous bits of the mapping value and contains a 0 in each of the other bits of the mapping value; and
   when receiving an address to access physical memory,
      generating a mapped address by performing a bitwise exclusive-OR of the received address with the mapping value; and
      accessing physical memory using the generated mapped address.

10. The method of claim 1 wherein the portion of physical memory to be mapped has a lowest address and a highest address that delimit the portion and wherein mapping includes generating a mapping value that, when applied to the addresses in the portion of physical memory, maps the addresses to the highest addresses.

11. The method of claim 10 wherein the mapping includes:
   when receiving an address of a location in physical memory,
      generating a mapped address by applying the mapping value to the received address; and accessing physical memory using the mapped address.

12. The method of claim 11 wherein the generating of the mapping value generates a difference between the highest address of the portion and the highest address of physical memory and the applying adds the difference to the received address.

13. The method of claim 11 wherein the applying includes performing a bitwise exclusive-OR on the received address with the mapping value.

14. The method of claim 10 wherein the generated mapping value has its highest-order, contiguous bits set to the bitwise inverse of the highest-order, contiguous bits of the lowest address that are the same as the highest address and has all other bits set to 0.

15. A system for remapping a portion of physical memory, the physical memory having memory locations, each location having a physical address, comprising:

a first component that receives an indication of the portion of physical memory to be mapped; and a second component that maps the locations of the indicated portion of physical memory to other physical addresses in physical memory so that the locations of the other portion of physical memory are mapped to contiguous physical addresses.

16. The system of claim 15 wherein the addresses are ordered from a lowest address to a highest address and wherein the locations of the indication portion are mapped to the highest addresses.

17. The system of claim 15 wherein the addresses of the locations of the indicated portion are contiguous before and after mapping.

18. The system of claim 15 wherein a number of locations in the indicated portion of physical memory is a power of 2.

19. The system of claim 15 wherein the indicated portion of physical memory has malfunctioned.

20. The system of claim 15 wherein after mapping the locations of the indicated portion of physical memory, the indicated portion of physical memory is outside a range of accessible physical memory.

21. The system of claim 15 wherein if the indicated portion of physical memory does not have a number of locations that is a power of 2, increasing the number of locations within the indicated portion so that it is a power of 2.

22. The system of claim 15 wherein before mapping the locations, the physical addresses of the locations of the other portion include physical addresses that are less than the physical addresses of the locations of the indicated portion and include physical addresses that are greater than the physical addresses of the locations of the indicated portion.

23. The system of claim 15 wherein the portion of physical memory to be mapped has a lowest physical address and a highest physical address that delimit the portion and wherein mapping includes identifying the highest-order, contiguous bits of the lowest physical address that are the same as the highest-order, contiguous bits of the highest physical address;

generating a mapping value that contains a bitwise inverse of each of the identified highest-order, contiguous bits as the highest-order, contiguous bits of the mapping value and contains a 0 in each of the other bits of the mapping value; and when receiving an address to access physical memory,
generating a mapped address by performing a bitwise exclusive-OR of the received physical address with the mapping value; and accessing physical memory using the generated mapped address.

24. The system of claim 15 wherein the portion of physical memory to be mapped has a lowest physical address and a highest physical address that delimit the indicated portion and wherein the mapping includes generating a mapping value that, when applied to the physical addresses in the portion of physical memory, maps the physical addresses to the highest physical addresses.

25. The system of claim 15 wherein the second component generates a mapped address by applying the mapping value to the received physical address and accesses physical memory using the mapped address, when receiving a physical address of a location in physical memory.

26. The system of claim 25 wherein the generating of the mapping value generates a difference between the highest address of the portion and the highest address of physical memory and the applying adds the difference to the received address.

27. The system of claim 25 wherein the applying includes performing a bitwise exclusive-OR on the received address with the mapping value.

28. The system of claim 25 wherein the generated mapping value has its highest-order, contiguous bits set to the bitwise inverse of the highest-order, contiguous bits of the lowest address that are the same as the highest address and has all other bits set to 0.

* * * * *

UNITED STATES PATENT AND TRADEMARK OFFICE
CERTIFICATE OF CORRECTION

PATENT NO. : 6,192,487 B1
DATED : February 20, 2001
INVENTOR(S) : Douceur

It is certified that error appears in the above-identified patent and that said Letters Patent is hereby corrected as shown below:

Column 5,
Line 14, "higherorder" should read -- higher-order --.

Signed and Sealed this

Thirtieth Day of March, 2004

JON W. DUDAS
*Acting Director of the United States Patent and Trademark Office*